US008562750B2

(12) United States Patent
Chen et al.

(10) Patent No.: US 8,562,750 B2
(45) Date of Patent: Oct. 22, 2013

(54) METHOD AND APPARATUS FOR PROCESSING BEVEL EDGE

(75) Inventors: Jack Chen, Fremont, CA (US); Yunsang Kim, Monte Sereno, CA (US)

(73) Assignee: Lam Research Corporation, Fremont, CA (US)

( * ) Notice: Subject to any disclaimer, the term of this patent is extended or adjusted under 35 U.S.C. 154(b) by 688 days.

(21) Appl. No.: 12/640,926

(22) Filed: Dec. 17, 2009

(65) Prior Publication Data
US 2011/0146703 A1 Jun. 23, 2011

(51) Int. Cl.
*B08B 7/04* (2006.01)
(52) U.S. Cl.
USPC .......... 134/1.2; 134/26; 134/30; 427/154; 427/284; 438/958; 438/976
(58) Field of Classification Search
USPC .................. 134/1, 4; 427/154, 284
See application file for complete search history.

(56) References Cited

U.S. PATENT DOCUMENTS

| | | | | |
|---|---|---|---|---|
| 5,716,534 | A * | 2/1998 | Tsuchiya et al. | 216/67 |
| 5,953,630 | A * | 9/1999 | Maeda et al. | 438/680 |
| 7,208,326 | B2 * | 4/2007 | Rennie et al. | 438/9 |
| 2006/0258177 | A1 | 11/2006 | Kastenmeier et al. | |
| 2007/0068900 | A1 | 3/2007 | Kim et al. | |
| 2008/0003830 | A1 * | 1/2008 | Qing et al. | 438/694 |
| 2008/0050923 | A1 | 2/2008 | Kim et al. | |
| 2008/0190448 | A1 * | 8/2008 | Kim et al. | 134/1.1 |
| 2009/0163026 | A1 | 6/2009 | Rathsack et al. | |
| 2009/0188627 | A1 | 7/2009 | Fang et al. | |

FOREIGN PATENT DOCUMENTS

KR 10-0598983 7/2006

OTHER PUBLICATIONS

Search Report dated Jul. 1, 2011 from International Application No. PCT/US2010/059585.
Written Opinion dated Jul. 1, 2011 from International Application No. PCT/US2010/059585.

* cited by examiner

*Primary Examiner* — Michael Kornakov
*Assistant Examiner* — Natasha Campbell
(74) *Attorney, Agent, or Firm* — Beyer Law Group LLP

(57) ABSTRACT

A method and apparatus for processing a bevel edge is provided. A substrate is placed in a bevel processing chamber and a passivation layer is formed on the substrate only around a bevel region of the substrate using a passivation plasma confined in a peripheral region of the bevel processing chamber. The substrate may undergo a subsequent semiconductor process, during which the bevel edge region of the substrate is protected by the passivation layer. Alternatively, the passivation layer may be patterned using a patterning plasma formed in an outer peripheral region of the processing chamber, the patterning plasma being confined by increasing plasma confinement. The passivation layer on outer edge portion of the bevel region is removed, while the passivation layer on an inner portion of the bevel region is maintained. The bevel edge of the substrate may be cleaned using the patterned passivation layer as a protective mask.

12 Claims, 13 Drawing Sheets

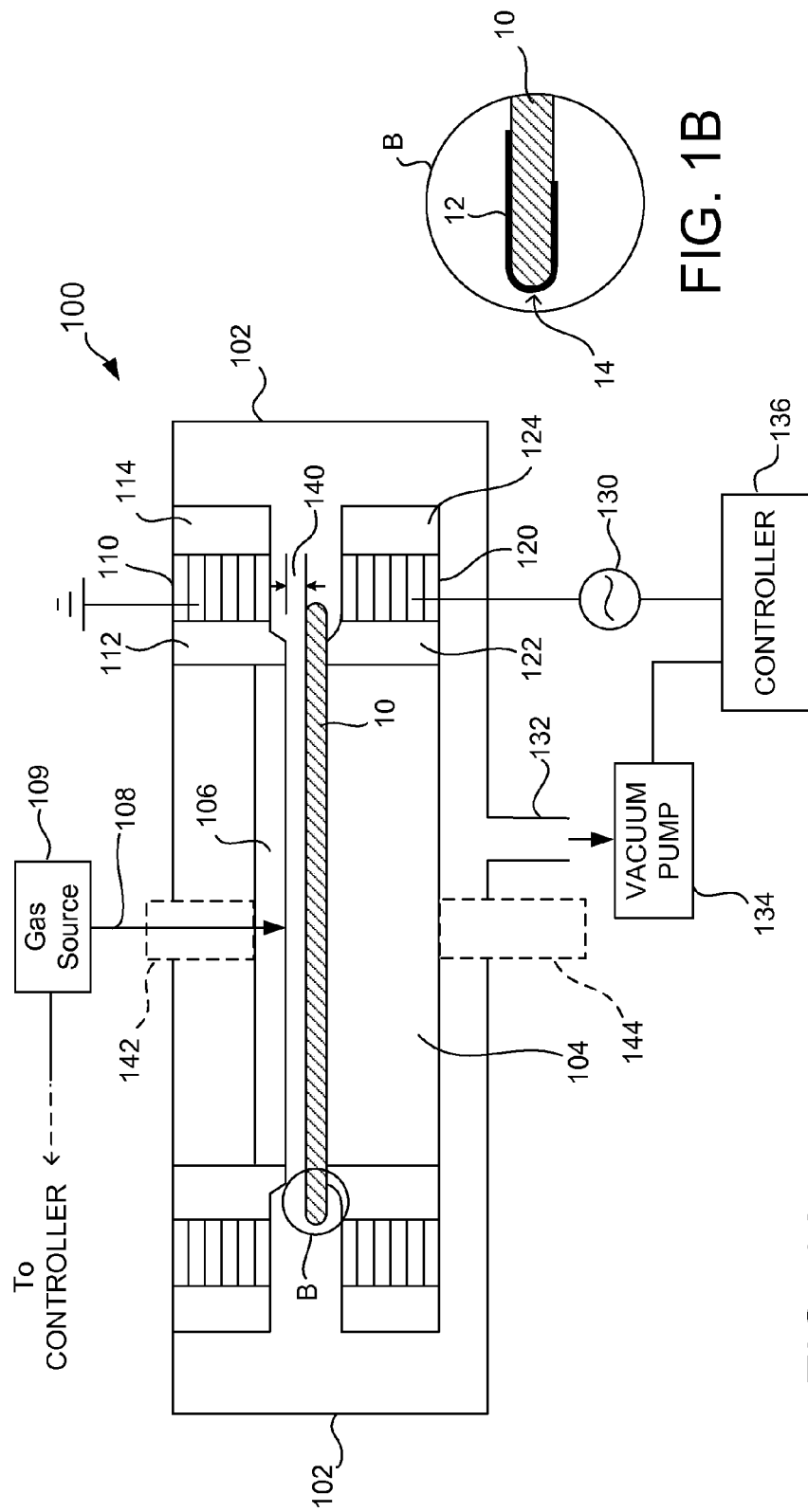

METHOD AND APPARATUS FOR PROCESSING BEVEL EDGE

FIELD OF INVENTION

The present invention relates to the formation of semiconductor devices. More particularly, the present invention relates to a method and apparatus for processing a bevel edge of a substrate during the formation of semiconductor devices.

BACKGROUND OF THE INVENTION

In the processing of a substrate, e.g., a semiconductor wafer or a glass panel such as one used in flat panel display manufacturing, plasma is often employed. A plurality of dies, or divided rectangular areas, are formed on the substrate, each of which will become an integrated circuit. The substrate is processed in a series of steps in which materials are deposited and selectively removed. Typically, such a substrate is coated with a thin film of hardened emulsion (such as a photoresist mask) prior to etching. Areas of the hardened emulsion are then selectively removed, causing parts of the underlying layer to become exposed. The substrate is then placed on a substrate support structure in a plasma processing chamber. An appropriate set of plasma gases is then introduced into the chamber and a plasma is generated to etch exposed areas of the substrate.

During an etch process, etch byproducts, for example polymers composed of Carbon (C), Oxygen (O), Nitrogen (N), Fluorine (F), etc., are often formed on the top and the bottom surfaces near a substrate edge (bevel edge). Etch plasma density is normally lower near the edge of the substrate, which results in accumulation of polymer byproducts on the top and on the bottom surfaces of the bevel edge. Typically, there are no dies present near the edge of the substrate, for example, between about 5 mm to about 15 mm from the bevel edge. However, as successive byproduct polymer layers are deposited on the top and bottom surfaces of the bevel edge as a result of several different etch processes, organic bonds that are normally strong and adhesive will eventually weaken during subsequent processing steps. Thus, polymer layers formed on the bevel edge would then peel or flake off, often onto another location of the substrate during post treatment, such as wet cleaning of the substrate surface, potentially affecting device yield by particle problems.

Dielectric films, such as SiN and $SiO_2$, and metal films, such as Al and Cu, can also be deposited on the bevel edge (including the top and bottom surfaces) and do not get removed during etching processes. These films can also accumulate and flake off during subsequent processing steps, and impact device yield.

Accordingly, the wafer edge, where deposited films terminate and overlap with underlying materials has been identified as a primary source of defects. The problem is exacerbated as manufactures seek to reduce edge exclusion in order to increase the number of die on the wafer. Although the greatest impact of edge defects is on adjacent die, material from edge defects can damage die at any point of the wafer.

SUMMARY OF THE INVENTION

To achieve the foregoing and in accordance with the purpose of the present invention a method for processing a substrate is provided. A substrate is placed in a bevel processing chamber, and a passivation plasma confined in a peripheral region of the bevel processing chamber is provided. Here, passivation plasma means plasma with deposition chemistry which is capable of forming or depositing a passivation layer. The passivation plasma may be provided by flowing a gas that enables the formation of the passivation layer to the peripheral region, which may be referred to as a passivation gas, generating the plasma from the gas, and confining the passivation plasma to the peripheral region. Using the plasma, a passivation layer is formed on the substrate only around a bevel region of the substrate. Then, the passivation plasma is stopped. The passivation layer may be a polymer film or an inorganic film.

In one aspect of the present invention, the bevel processing chamber may include a substrate support receiving the substrate, the substrate support having a diameter smaller than a diameter of the substrate, a bottom edge electrode surrounding the substrate support and electrically isolated therefrom, a gas distribution plate opposing the substrate support, and a top edge electrode opposing the bottom edge electrode, the top edge electrode surrounding the gas distribution plate and electrically isolated therefrom.

In the bevel processing chamber, the location of the passivation plasma confinement can be controlled by controlling a distance between the gas distribution plate and a surface of the substrate facing the distribution plate. The passivation plasma may be generated between the bottom edge electrode and the top edge electrode by providing an RF power.

The substrate with the passivation layer may undergo one or more subsequent processes, during which the bevel edge region of the substrate being protected by the passivation layer. The passivation layer may be removed after the subsequent process(es).

In one manifestation of the invention, after the passivation layer is formed on the substrate and the passivation plasma is stopped, a patterning plasma is formed in a further outward peripheral region (referred to as an outer peripheral region) of the processing chamber by increasing plasma confinement; such that the patterning plasma is formed in the outer peripheral region farther from a center of the substrate. The patterning plasma may be provided by flowing a patterning gas to the outer peripheral region, generating the pattering plasma from the patterning gas, and confining the patterning plasma to the outer peripheral region. The passivation layer is patterned in situ of the chamber by using the patterning plasma, by removing the passivation layer on an outer edge portion of the bevel region, while maintaining the passivation layer on an inner portion of the bevel region. Then, the patterning plasma is stopped. The bevel edge of the substrate is cleaned using the patterned passivation layer as a protective mask. The remaining passivation layer is then removed.

In the bevel processing chamber, the plasma confinement to the outer peripheral region may be increased by reducing a distance between the gas distribution plate and a surface of the substrate facing the distribution plate, or by increasing the diameter of the gas distribution plate or confinement ring. The patterning plasma may be generated between the bottom edge electrode and the top edge electrode by providing an RF power.

Patterning the passivation layer may expose an underlying layer below the passivation layer in the outer edge portion, and the exposed underlying layer may be removed form the outer edge portion during the bevel edge cleaning process. The underlying layer may be made of an oxide film or out of defect causing layers.

In the bevel edge cleaning process, a bevel edge cleaning plasma may be provided in the bevel processing chamber. The outer edge portion of the substrate is cleaned using the bevel edge cleaning plasma, and the bevel edge cleaning plasma is stopped. The bevel edge cleaning plasma may be provided by flowing a cleaning gas to the peripheral region, and generating the bevel edge cleaning plasma from the cleaning gas by providing an RF power.

The remaining passivation layer may be removed using a stripping plasma provided in the bevel processing chamber. The stripping plasma is provided by reducing the plasma confinement in the bevel processing chamber such that the stripping plasma extends toward the center of the substrate to cover the remaining passivation layer. Then the stripping plasma is stopped.

In another manifestation of the invention a method for cleaning a bevel edge of a substrate is provided. A substrate is placed in a bevel processing chamber, where the substrate already has an existing passivation layer formed thereon. A patterning plasma confined in an outer peripheral region of the bevel processing chamber is provided. The passivation layer is patterned using the patterning plasma, by removing the passivation layer on an outer edge portion of the bevel region of the substrate, while maintaining the passivation layer on an inner portion of the bevel region. The patterning plasma is stopped. The bevel edge of the substrate is cleaned using the patterned passivation layer as a protective mask. The remaining passivation layer is removed.

The patterning plasma may be provided by flowing a patterning gas to the outer peripheral region, generating the patterning plasma from the patterning gas, and confining the patterning plasma to the outer peripheral region.

In the bevel processing chamber, the location of the patterning plasma confinement can be controlled by controlling a distance between the gas distribution plate and a surface of the substrate facing the distribution plate, and the patterning plasma is generate between the bottom edge electrode and the top edge electrode by providing an RF power.

The bevel edge may be cleaned by flowing a cleaning gas to the peripheral region in the bevel processing chamber, generating a bevel edge cleaning plasma from the cleaning gas, cleaning the outer edge portion of the substrate using the bevel edge cleaning plasma, and stopping the bevel edge cleaning plasma. In the bevel processing chamber, the cleaning gas may be provided through a gap between the gas distribution plate and a surface of the substrate facing the distribution plate. The cleaning plasma is generate between the bottom edge electrode and the top edge electrode by providing an RF power.

In another manifestation of the invention an apparatus for processing a bevel edge of a substrate is provided. The apparatus comprises a bevel processing chamber, including a chamber wall forming a bevel processing chamber enclosure, a substrate support for supporting a substrate within the bevel processing chamber enclosure, wherein the substrate support has a diameter smaller than a diameter of the substrate, a gas inlet for providing gas into the bevel processing chamber enclosure, a gas distribution plate coupled to the gas inlet, the gas distribution plate opposing the substrate support, and at least one electrode for providing power to the bevel processing chamber enclosure for sustaining a plasma. The at least one electrode includes a bottom edge electrode surrounding the substrate support and electrically isolated therefrom, and a top edge electrode opposing the bottom edge electrode, the top electrode surrounding the gas distribution plate and electrically isolated therefrom. The bevel processing chamber further includes a pressure regulator for regulating the pressure in the bevel processing chamber enclosure, and a gas outlet for exhausting gas from the bevel processing chamber enclosure. The apparatus further comprises a gas source in fluid connection with the gas inlet, including at least a passivation gas source, and a controller controllably connected to the gas source and the electrodes. The controller comprises at least one processor and computer readable media. The computer readable media includes computer readable code for generating a passivation plasma from a passivation gas, computer readable code for confining the passivation plasma to a peripheral region of the bevel processing chamber, computer readable code for forming, using the passivation plasma, a passivation layer on the substrate around a bevel region of the substrate, and computer readable code for stopping the passivation plasma.

In one aspect of the invention, the gas source may further include a patterning gas source and a cleaning gas source, and the computer readable media may further include computer readable code for generating a patterning plasma from a patterning gas, computer readable code for confining the patterning plasma in an outer peripheral region of the processing chamber, by increasing plasma confinement such that the patterning plasma is formed in the outer peripheral region farther from a center of the substrate, computer readable code for patterning the passivation layer using the patterning plasma, by removing the passivation layer on an outer edge portion of the bevel region, while maintaining the passivation layer on an inner portion of the bevel region, computer readable code for stopping the patterning plasma, and computer readable code for cleaning the bevel edge of the substrate using the patterned passivation layer as a protective mask.

The gas source may further include a stripping gas source, and the computer readable media may further comprise computer readable code for generating a stripping plasma from a stripping gas, by reducing the plasma confinement such that the stripping plasma extends toward the center of the substrate to cover the remaining passivation layer, computer readable code for stripping the remaining passivation layer using the stripping plasma, and computer readable code for stopping the stripping plasma.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 1A and 1B are schematic views of a bevel processing chamber that may be used in practicing the present invention.

DETAILED DESCRIPTION OF THE PREFERRED EMBODIMENTS

Figure 2A:
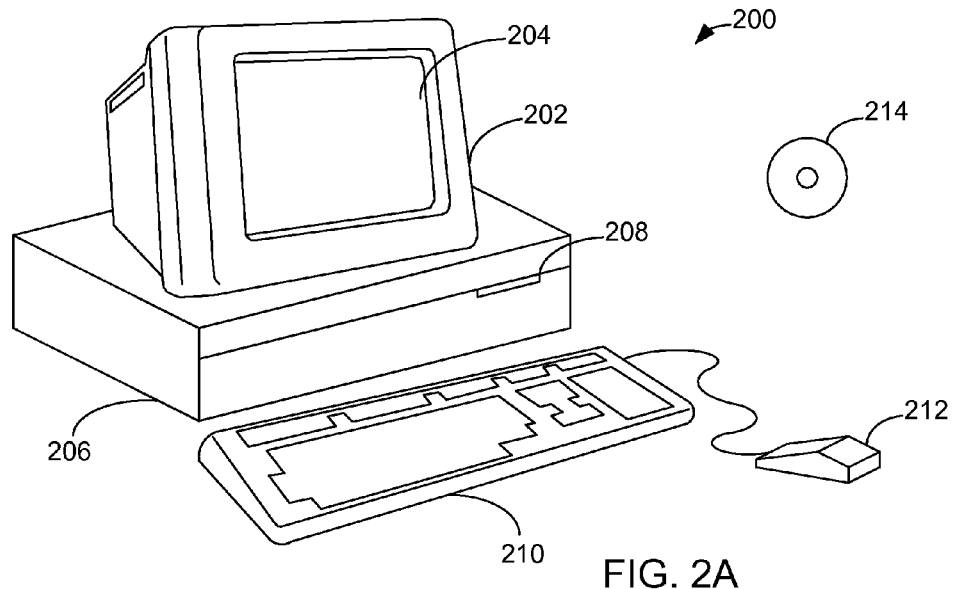
FIGS. 2A and 2B are diagrams schematically illustrating a computer system, which is suitable for implementing a controller used in embodiments of the present invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As discussed above, Applicants have identified that the bevel edge of a substrate such as a semiconductor wafer is a primary source of defects due to particle problems and contamination. The bevel edge, in which deposited films terminate and overlap with underlying materials, is exposed to various semiconductor processes such as dry etch or wet clean. The bevel edge of a substrate suffers degradation through such semiconductor processes, if the bevel edge is not well controlled or protected. For example, the bevel edge is not protected by photoresist and exposed to etchants due to a built-in edge bead removal process for photoresist. Such exposure to various semiconductor processes can lead to chipping of the bevel edge, undercut of edge structure, and the like, which may result in wafer defect and yield loss. In addition, Applicants have realized that more precise bevel edge control and cleaning process are required in order to increase the number of dies on the wafer by reducing the edge exclusion.

In accordance with embodiments of the present invention, a passivation layer is provided to the bevel edge of the substrate from being exposed to potentially harmful semiconductor processes. A well-controlled, confined plasma is used to coat the passivation layer onto the bevel edge. The embodiments of the present invention can be implemented using, for example, a plasma-based bevel processing apparatus such as 2300® Coronus™ systems, available from Lam Research Corporation, Fremont, Calif. However, the present invention is not limited to a specific bevel processing apparatus. In addition, the process parameters such as pressure, power, duration of time, flow rate, and the like are presented in this description for illustrative purpose, and thus they are not limiting.

To facilitate understanding, FIG. 1A is a schematic view of an example of a bevel processing chamber 100 that may be used to perform embodiments of the present invention. As shown in FIG. 1B, the bevel (or "bevel edge") 12 of the substrate (wafer) 10 is an edge portion of the substrate 10, including the edge 14, part of the top surface of the substrate 10, and bottom surface of the substrate 10 near the edge 14 of the substrate 10. The bevel processing chamber 100 is enclosed by chamber walls 102. The bevel processing chamber 100 has a substrate support (wafer support) 104 on which a substrate 10 is placed. In one embodiment of the present invention, the substrate support 104 is an electrostatic chuck, which may be powered by a RF (radio frequency) power source (not shown). Alternatively, the substrate support 104 can be DC (direct current) biased, or grounded. The substrate support 104 has a diameter that is less than a diameter of the substrate 10 so that the outer edge of the substrate 10 extends beyond the substrate support 104 around the circumference or perimeter of the substrate 10. Similarly, the gas distribution plate 106 has a diameter that is less than the diameter of the substrate 10 so that the outer edge of the substrate 10 extends beyond the gas distribution plate 106 around the circumference or perimeter of the substrate 10.

Opposing the substrate support 104 is a gas distribution plate 106 with a gas inlet 108, which is connected to a gas source 109. The gas distribution plate 106 is spaced apart from the substrate support 104 and a top surface of the substrate 10, and also acts as a central cover. The gas distribution plate 106 may be a dielectric material, or electrically conductive and grounded. Preferably, the distance 140 between the gas distribution plate 106 and the top surface of the substrate 10 on the substrate support 104 is controllable. The distance (gap) 140 may be controlled by lowering the gas distribution plate 106, raising the substrate support 104, or the both. During processing of the substrate 10, the chamber 100 can be RF powered to generate capacitively coupled processing plasma or inductively coupled processing plasma.

Surrounding the edge of the substrate support 104, there is a bottom edge electrode 120, made of conductive materials, such as aluminum (Al). A bottom dielectric ring 122 may be provided between the substrate support 104 and the bottom edge electrode 120, so as to electrically separate the substrate support 104 and the bottom edge electrode 120. The substrate 10 is not in contact with the bottom edge electrode 120. An outer bottom ring 124 may also be provided so as to surround the bottom edge electrode 120, which extends the surface of the bottom edge electrode 120 facing the substrate 10. The outer bottom ring 124 may be a dielectric or insulating ring. The bottom dielectric ring 122 may be made of ceramic and also act as a bottom edge confinement ring to physically confine the plasma on the backside of the substrate. The outer diameter of the bottom dielectric ring 122 may be variable so as to control the physical confinement of the plasma on the backside of the substrate.

Similarly, surrounding the gas distribution plate 106, there is a top edge electrode 110, made of conductive materials, such as aluminum (Al). The top edge electrode 110 may be electrically insulated from the gas distribution plate 106 by a top dielectric ring 112. An outer top ring 114 may also be provided so as to surround the top edge electrode 110, which extends the surface of the top edge electrode 110 facing the substrate 10. The outer top ring 114 may be a dielectric or insulating ring. The top dielectric ring 112 may be made of ceramic and also act as a top edge confinement ring to physically confine the plasma on the frontside of the substrate. The outer diameter of the top dielectric ring 112 may be variable so as to control the physical confinement of the plasma on the frontside of the substrate.

The processing plasma is confined in a peripheral region of the bevel processing chamber 100. In accordance with an embodiment of the present invention, the plasma is confined in the peripheral region corresponding to a space formed between the top edge electrode 110 and the bottom edge electrode 120. The top surface and the bottom surface defining the space for plasma confinement may be extended outwardly by the surfaces of the top insulating ring 114 and the bottom insulating ring 124, respectively.

In one embodiment of the present invention, the bottom edge electrode 120 is coupled to an RF power source 130 and the top edge electrode 110 is grounded. During a bevel edge processing, the RF power source 130 may supply RF power to generate a plasma between the top edge electrode 110 and the bottom edge electrode 120. In another embodiment, both of the top edge electrode 110 and the bottom edge electrode 120 are grounded, and a RF power may be provided via an additional cathode ring electrode (not shown) which is provided outside the top and bottom insulating rings 114 and 124, and is coupled to the RF power source 130. The cathode ring electrode may have a channel facing the bevel edge. Alternatively, in yet another embodiment, the top edge electrode 110 and the cathode ring electrode (not shown) may be grounded, and the bottom edge electrode 120 may be coupled to the RF power source 130. In yet another embodiment, both of the top edge electrode 110 and the bottom edge electrode 120 are grounded, and a RF power may be provided via an inductive coils (not shown) surrounding the substrate edge and the space between the top and bottom edge electrodes 110 and 120. The inductive coil (not shown) is coupled to the RF power source 130 and used to generate an inductively coupled plasma near the substrate edge.

The spacing (gap) 140 between the gas distribution plate 106 and the substrate 10 is less than 1 mm to ensure no plasma is formed between the gas distribution plate 106 and the substrate 10 during the bevel edge processing. The processing gas(es) may be supplied from any gas source 109 that is in fluid connection with gas inlet 108, through the spacing 140 to the peripheral region, and is exhausted from the chamber 100 through a gas outlet 132 by the exhaust (vacuum) pump 134. In one embodiment, the gas inlet 108 is located near the center of the gas distribution plate 106. Alternatively, the processing gas(es) can also be supplied through gas inlet(s) disposed in other parts of the processing chamber 100. A controller 136 is controllably connected to the RF sources 130, the gas source 109, the vacuum pump 134, and any other units or sections.

In accordance with one embodiment of the present invention, the bevel processing chamber 100 may further include at least one of a upper vertical displacement unit 142 and a lower vertical displacement unit 144, as shown in FIG. 1A. The upper vertical displacement unit 142 is configured to move the gas distribution plate 106 in the vertical direction so as to change the distance (gap) 140 between the upper surface of the substrate 10 and the lower surface of the gas distribution plate 106. Similarly, the lower vertical displacement unit 144 is configured to move the substrate support 104 in the vertical direction so as to change the distance (gap) 140 between the upper surface of the substrate 10 and the lower surface of the gas distribution plate 106. The controller 136 may coupled to and control the upper and lower vertical displacement unit 142 and 144.

Figure 2B:
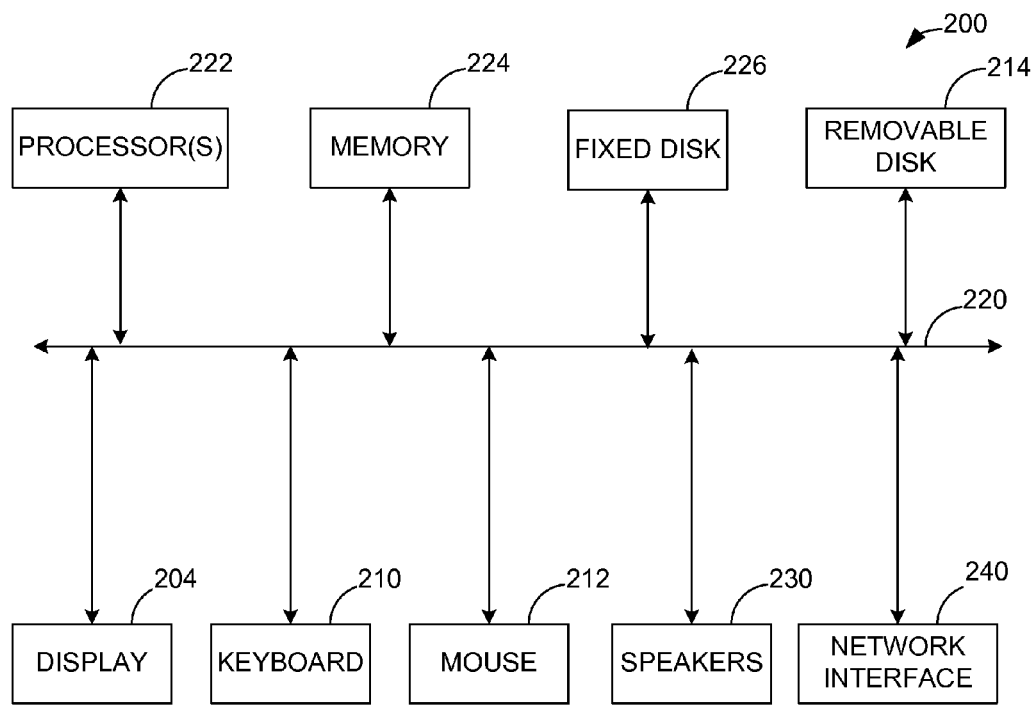

FIGS. 2A and 2B illustrate a computer system 200, which is suitable for implementing the controller 136 used in embodiments of the present invention. FIG. 2A shows one possible physical form of the computer system. Of course, the computer system may have many physical forms ranging from an integrated circuit, a printed circuit board, and a small handheld device up to a huge super computer. The computer system 200 includes a monitor 202, a display 204, a housing 206, a disk drive 208, a keyboard 210, and a mouse 212. A disk 214 is a computer-readable medium used to transfer data to and from the computer system 200.

FIG. 2B is an example of a block diagram for the computer system 200. Attached to a system bus 220 is a wide variety of subsystems. Processor(s) 222 (also referred to as central processing units, or CPUs) are coupled to storage devices, including a memory 224. The memory 224 includes a random access memory (RAM) and a read-only memory (ROM). As is well known in the art, ROM acts to transfer data and instructions uni-directionally to the CPU, and RAM is used typically to transfer data and instructions in a bi-directional manner. Both of these types of memories may include any suitable of the computer-readable media described below. A fixed disk 226 is also coupled bi-directionally to the CPU 222; it provides additional data storage capacity and may also include any of the computer-readable media described below. The fixed disk 226 may be used to store programs, data, and the like and is typically a secondary storage medium (such as a hard disk) that is slower than primary storage. It will be appreciated that the information retained within the fixed disk 226 may, in appropriate cases, be incorporated in standard fashion as a virtual memory in the memory 224. A removable disk 214 may take the form of any of the computer-readable media described below.

The CPU 222 is also coupled to a variety of input/output devices, such as a display 204, a keyboard 210, a mouse 212, and speakers 230. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. The CPU 222 optionally may be coupled to another computer or telecommunications network using a network interface 240. With such a network interface, it is contemplated that the CPU 222 might receive information from the network, or might output information to the network in the course of performing the above-described method steps. Furthermore, method embodiments of the present invention may execute solely upon the CPU 222 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 3:
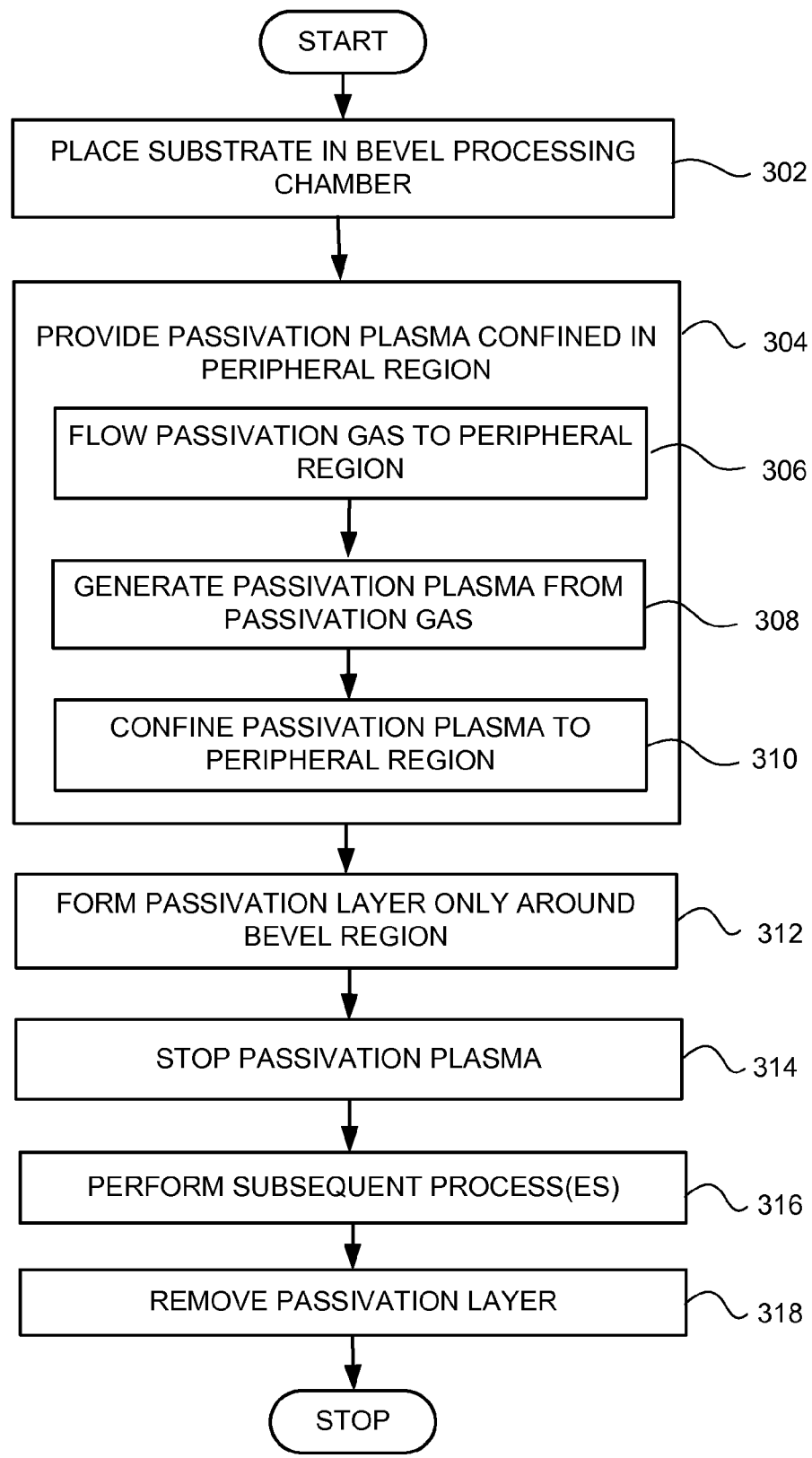
FIG. 3 is a flow chart of a method for processing a substrate, in accordance with one embodiment of the present invention.

FIG. 3 is a flow chart of a method for processing a substrate, in accordance with one embodiment of the present invention. In this embodiment, a passivation layer is formed on the bevel region so as to protect the bevel edge portion in a subsequent process or processes. FIGS. 4A-4D schematically illustrate an example of the bevel edge portion of a wafer in the peripheral region during the bevel passivation process and subsequent processes. A substrate 10 is placed in a bevel processing chamber (302), for example, the bevel processing chamber 100 discussed above. Although any bevel processing chamber capable of controllably confining a plasma in a peripheral region of the chamber may be used for the present invention, the following embodiments of the present invention are mainly explained using the bevel processing chamber 100 as an illustrative example.

Figure 4A:
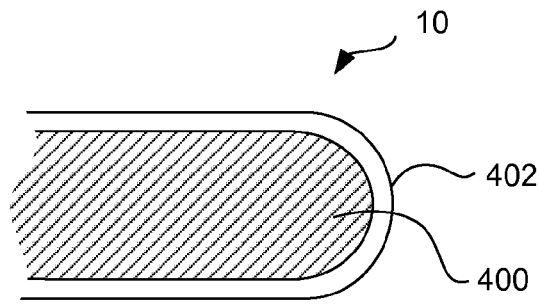
FIGS. 4A-4D are diagrams schematically illustrating an example of the bevel edge portion of a substrate in the peripheral region during the bevel passivation process and optional subsequent processes in accordance with one embodiment of the present invention.
Figure 4B:
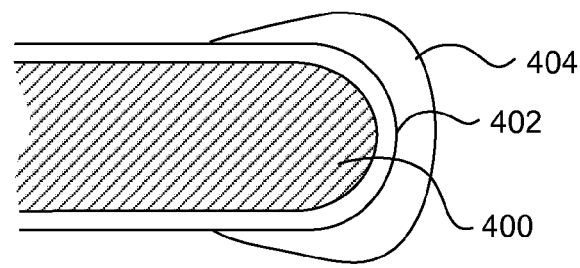

The substrate 10 may be a semiconductor wafer 400 with an oxide layer 402 formed thereon, as shown in FIG. 4A. A passivation plasma confined in a peripheral region of the bevel processing chamber is provided (304). For example, the confined plasma is provided by flowing a passivation gas to the peripheral region (306), generating the passivation plasma from the passivation gas (308), and confining the passivation plasma to the peripheral region (310). Using the passivation plasma (not shown), a passivation layer 404 is formed on the substrate only around a bevel region of the substrate (312), as shown in FIG. 4B. Then, the passivation plasma is stopped (314). It should be noted that the passivation layer 404 may be formed on the bevel region including both of the upper surface and the lower surface of the substrate in the vicinity of the edge of the substrate, as shown in FIG. 4B. Alternatively, the passivation layer 404 may be formed on the bevel region except the lower surface of the substrate if the passivation plasma is provided from the upper surface side of the substrate.

The passivation layer 404 may be a polymer film or an inorganic film, depending on the subsequent semiconductor process during which the bevel edge is to be protected. For example, the passivation (deposition) gas may be a hydrocarbon and fluorine containing gas, such as methane, ethylene, butadiene, fluoromethane, and the like, combined with a filler gas such as $N_2$, Ar, He, and the like. By controlling the passivation gas components, polymer of desired composition can be deposited onto the bevel edge of the substrate. Similarly, non-hydrocarbon chemistry can also be used to form a passivation layer. For example, a Si containing gas, such as dichlorosilane, tetraethoxysilane, and the like, with oxygen or a nitrogen containing gas such as ammonia may be used to form a $SiO_2$ or $Si_xN_y$ film. Such inorganic passivation layers may be suitable when the chamber is heated to a high temperature.

Figure 4C:
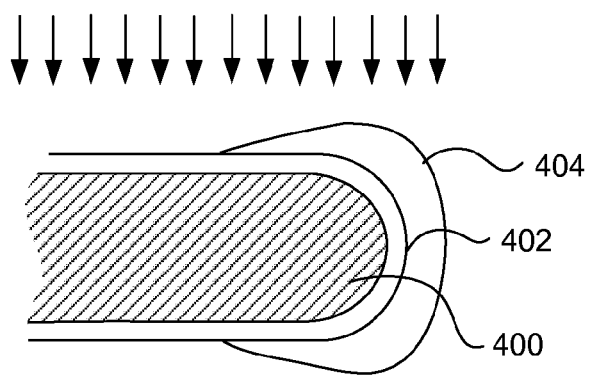
Figure 4D:
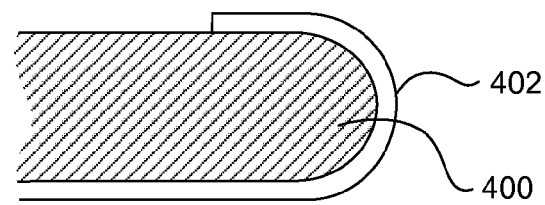

After the passivation layer 404 is deposited, the substrate 10 may go through any subsequent semiconductor processing (such as etching, patterning, cleaning, or other deposition) (316). The bevel edge region of the substrate 10 is protected by the passivation layer 404 during the subsequent process (es), as shown in FIG. 4C. Such subsequent semiconductor processing may be performed using a different chamber. In this example, the subsequent process is etching (removal) of the underlying oxide layer 402. Once the semiconductor processing is done, the passivation layer may be removed (318), as shown in FIG. 4D, either using the same bevel processing chamber with a chemistry for removing (etching or stripping) the passivation layer, or using another tool.

While the bevel processing chamber is conventionally only used to etch or clean the bevel edge, the embodiments of the present invention deposit, not etch, a protective layer (passivation layer) on the bevel edge portion. The radial location of the passivation layer from the center of the wafer is controlled by plasma confinement (the deposition distance control). For example, the distance control of the order of millimeter, a different confinement ring (hardware) is used. That is, the ring/electrode configuration of the bevel processing chamber may be changed. For sub-millimeter distance control, the plasma confinement may be controlled by recipe conditions such as the gap between the substrate and the dielectric (ceramic) ring through which the deposition gas is fed to the peripheral region, and the pressure of the processing chamber. Varying the location of the passivation gas feed may also be used to control the deposition distance. The thickness profile of the passivation layer (deposition film) is similar to the etch profile, and exponentially increases as the deposition distance approaches the wafer edge, resulting in a very sharp transition step. The thickness of the passivation layer is typically a linear function of deposition time, deposition pressure, and RF power. These parameters are controlled to deposit a passivation layer of a desired thickness at a desired distance/location.

For example, in the bevel processing chamber 100 (FIG. 1A), confining the passivation plasma (310) may include controlling the distance 140 between the gas distribution plate 106 and the upper surface of the substrate 10 facing the distribution plate 106. The passivation plasma is generated between the bottom edge electrode 120 and the top edge electrode 110 by providing an RF power from the RF power source 130. It should be noted that the top dielectric ring 112 has a protrusion on the inner (wafer center) side such that the distance between the surface of the protrusion and the upper surface of the substrate is the same as the gap 140. The bottom dielectric ring 122 also has a protrusion on the inner side so as to expose the back of the substrate 10 in the bevel region, as shown in FIG. 1A. The passivation plasma is confined by the surfaces of the top dielectric ring 112, the top edge electrode 110, the top insulating ring 114, the bottom dielectric ring 122, the bottom edge electrode 120, and the bottom insulating ring 124.

An example of a recipe for a bevel processing is as follows: A chamber pressure is set between 1 Torr and 4 Torr, preferably between 1250 mTorr to 4 Torr, more preferably between 1.5 Torr and 4 Torr. The RF source provides RF power between 200 watts and 1000 watts. In an example, a passivation gas of 120 sccm of $C_2H_4$ and 120 sccm of $N_2$ is provided under 4 Torr with RF power of 400 watts. $CH_4$ may also be used in place of $C_2H_4$. The deposition time may be from a few seconds, or up to a few minutes, depending on the desired thickness of the passivation layer and other parameters. The resulting passivation layer may have a thickness of a few nanometer to several microns at the bevel region. The passivation layer may have a thickness of several micron meters. The gap 140 is set between 0.3 mm up to a few millimeters, preferably large to allow for less plasma confinement and increased coating region. In an example, it is preferable to use a lower power (about 400 watts), a smaller gap (about 0.35 mm), and a moderate to high pressure (about 1.9 Torr to 4 Torr) to form a more stable and uniform passivation layer and to increase the rate of coating. A larger gap, a lower pressure, and/or a higher power may cause flaking condition of the passivation layer.

FIGS. 5A-5E are process flow charts of a method for processing a substrate in accordance with another embodiment of the present invention. In this embodiment, the passivation layer is used to protect the device region of the substrate (wafer) during the bevel edge cleaning. FIGS. 6A-6F schematically illustrate an example of the bevel edge portion of a substrate in the peripheral region during the bevel processing. In this embodiment, a passivation layer is first formed on the bevel region of a substrate in a similar manner using the steps 302 through 314 as described above. A substrate 10 is placed in a bevel processing chamber (502), for example, the bevel processing chamber 100 described above. The substrate 10 may be a semiconductor wafer 600 with an oxide layer 602 formed thereon, as shown in FIG. 6A. A passivation plasma 604 confined in a peripheral region 606 of the bevel processing chamber is provided (504), as shown in FIG. 6B. For example, the confined plasma is provided by flowing a passivation gas to the peripheral region (506), generating the passivation plasma from the passivation gas (508), and confining the passivation plasma to the peripheral region (510). The passivation gas may be a C and H containing gas. Preferably, a gas containing $C_2H_4$ and $N_2$. Alternatively, for forming an inorganic passivation layer such as $SiO_2$ of $Si_xN_x$, a passivation gas containing Si element can be used. The gap 140 may be set between 0.60 mm to 0.9 mm, preferably about 0.65 mm, by setting the gas distribution plate 106 at a high position such that the passivation plasma covers the peripheral region to passivate.

Using the passivation plasma 604, a passivation layer 608 is formed on the substrate 10 only around a bevel region of the substrate (512), as shown in FIG. 6B. For example, a polymer film is deposited for 10-15 seconds to have a thickness about 1 μm. Depending on the distance of the gap 140 and the desired thickness, the deposition time may be 30 seconds or more. In this example, the passivation layer 608 is formed on the edge and the upper surface of the substrate in the vicinity of the edge, but not on the lower surface, in the bevel region, as shown in FIG. 6B. Then, the passivation plasma is stopped (514).

Figure 5C:
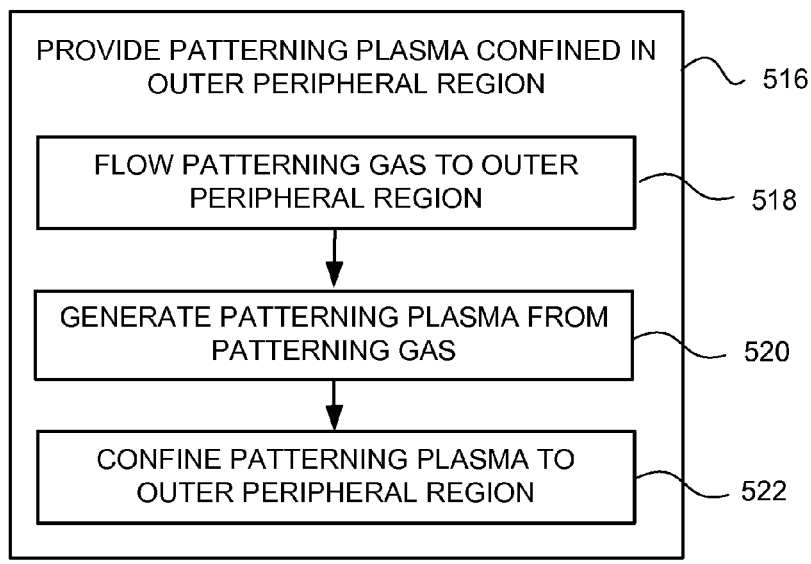
Figure 6A:
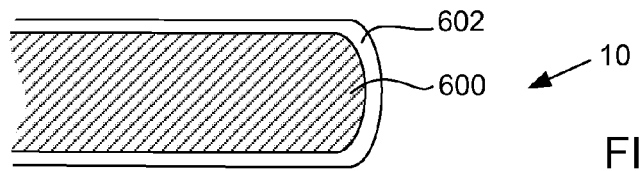
FIGS. 6A-6E are diagrams schematically illustrating an example of the bevel edge portion of a substrate in the peripheral region during the bevel processing, in accordance with one embodiment of the present invention.
Figure 6B:
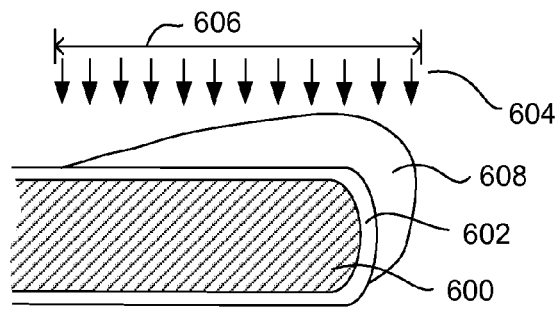
Figure 6C:
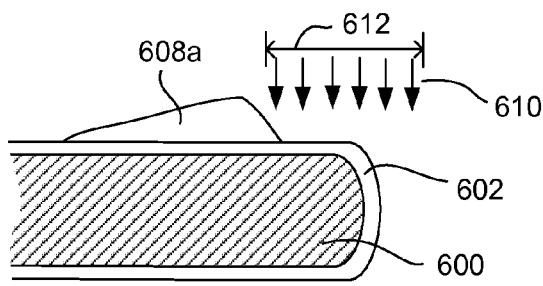

After depositing the passivation layer 608, a patterning plasma 610 is provided (516). The patterning plasma 610 is confined in an outer peripheral region 612 of the processing chamber, by increasing plasma confinement such that the patterning plasma 610 is formed in the outer peripheral region 612 that is farther from the center of the substrate than the peripheral region 606, as shown in FIG. 6C. It should be noted that the outer edge portion of the bevel region corresponds to the outer peripheral region 612 where the patterning plasma is formed, as shown in FIG. 6C. The patterning plasma 610 may be provided by flowing a patterning gas to the outer peripheral region 612 (518), generating the patterning plasma 610 from the patterning gas (520), and confining the patterning plasma 610 to the outer peripheral region 612 (522), as shown in FIG. 5C. For example, the patterning gas may be oxygen ($O_2$) gas, preferably $O_2$ only, which is highly selective to etch polymer.

The passivation layer 608 is patterned using the patterning plasma 610 (524). The $O_2$-based patterning process may continue about 10 seconds to 15 seconds. Since the patterning plasma 610 is further pushed away from the center region of the substrate, part of the passivation layer 608 which is on an outer edge portion of the bevel region is removed, while the remaining part of the passivation layer 608a is maintained on an inner portion of the bevel region, as shown in FIG. 6C. After the patterning, the patterning plasma 610 is stopped (526).

Figure 7:
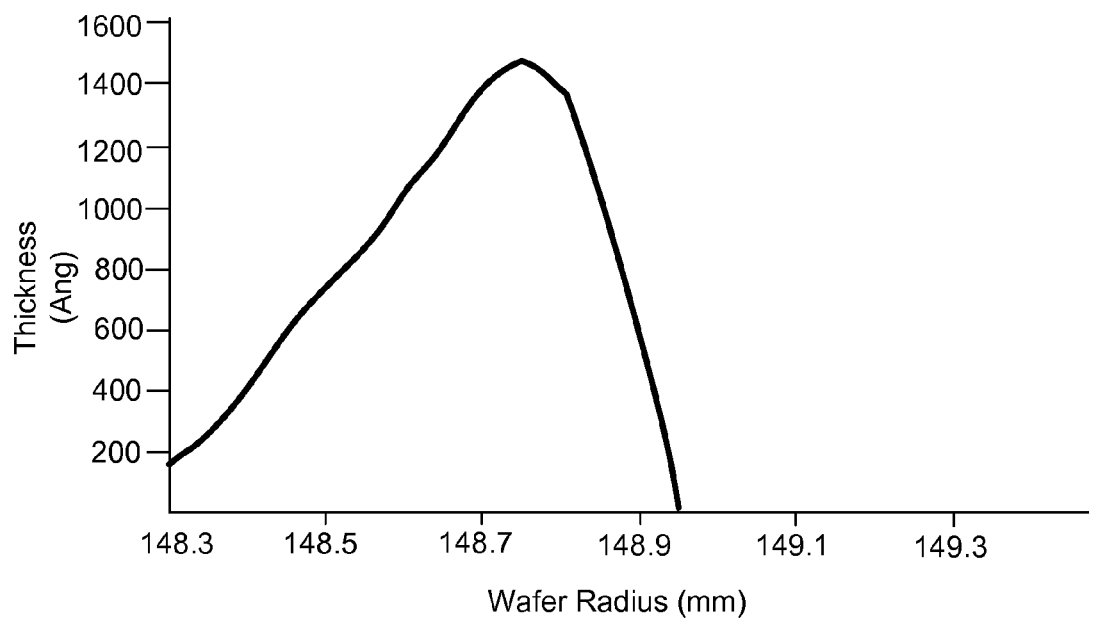
FIG. 7 is a diagram schematically illustrating an example of the profile of a patterned (remaining) passivation layer after polymer coating followed by $O_2$ etching, in accordance with one embodiment of the present invention.

In accordance with one embodiment of the present invention, the distance (gap) 140 between the gas distribution plate 106 and a surface of the substrate 10 facing the gas distribution plate 106 is reduced to increase the plasma confinement such that the patterning plasma 610 is further pushed away from the center portion toward the edge and confined into the outer peripheral region 612, compared with the passivation plasma 604. The gas distribution plate 106 may be moved downward by the upper vertical displacement unit 142 so as to reduce the gap 140. For example, the gas distribution plate 106 may be set at a lower position providing a 0.30 mm gap. Alternatively, the substrate support 104 may be moved upward by the lower vertical displacement unit 144 so as to reduce the gap 140. The patterning plasma 610 is formed between the bottom edge electrode 120 and the top edge electrode 110 by providing an RF power using the RF power source 130. FIG. 7 schematically illustrates an example of the profile of a patterned (remaining) passivation layer after polymer coating (with a 0.65 mm gap) followed by $O_2$ etching (with a 0.30 mm gap).

The bevel edge of the substrate is then cleaned using the patterned passivation layer 608a as a protective mask (528). FIG. 5D is a more detailed process flow chart for of the bevel cleaning. The bevel edge cleaning process (528) may include providing a bevel edge cleaning plasma 614 in the bevel processing chamber (530), cleaning the outer edge portion of the substrate using the bevel edge cleaning plasma 614 (532), and stopping the bevel edge cleaning plasma 614. The bevel edge cleaning plasma 614 may be provided by flowing a cleaning gas to the peripheral region, and generating the bevel edge cleaning plasma from the cleaning gas by providing an RF power.

Figure 6D:
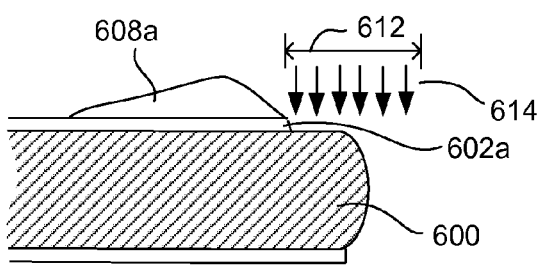

It should be noted that the bevel edge cleaning plasma 614 may be confined in the outer peripheral region 612 similarly to the patterning plasma 610, as shown in FIG. 6D. However, since the device area (region which is not to be touched by the cleaning plasma) is protected by the remaining passivation layer 608a, the plasma confinement of the bevel edge cleaning does not have to be strict or precise as that for the patterning plasma 610. For example, the cleaning plasma may be formed in the peripheral region which is (inwardly) broader than the outer peripheral region so long as the area to be affected by the cleaning plasma is covered and protected by the remaining passivation layer 608a.

In accordance with one embodiment of the present invention, the patterning of the passivation layer 608 (524) may expose the underlying layer 602 below the passivation layer in the outer edge portion, as shown in FIG. 6C. In such a case, the bevel edge cleaning process (528) may include removing (etching) the exposed underlying layer 602 from the outer edge portion, using the remaining passivation layer 608a as an etch mask. If the underlying layer is made of an oxide film, for example, an etching chemistry containing $CHF_3$ and $N_2$ may be used as a cleaning gas to remove (etch) the exposed oxide film 602 as part of the bevel edge cleaning process. This cleaning process may continue about 10 to 30 seconds. The $CHF_3$—$N_2$ chemistry is highly selective to oxide while it has a very low etch rate for polymer (passivation layer material). In addition, $CF_4$—$N_2$ chemistry may also be used to pattern the oxide layer. Being patterned with the remaining passivation layer 608a as a mask, the remaining (patterned) oxide layer 602a has a very steep etch profile, compared with such an oxide layer remaining after a conventional plasma bevel edge cleaning process without using a passivation layer.

Figure 5A:
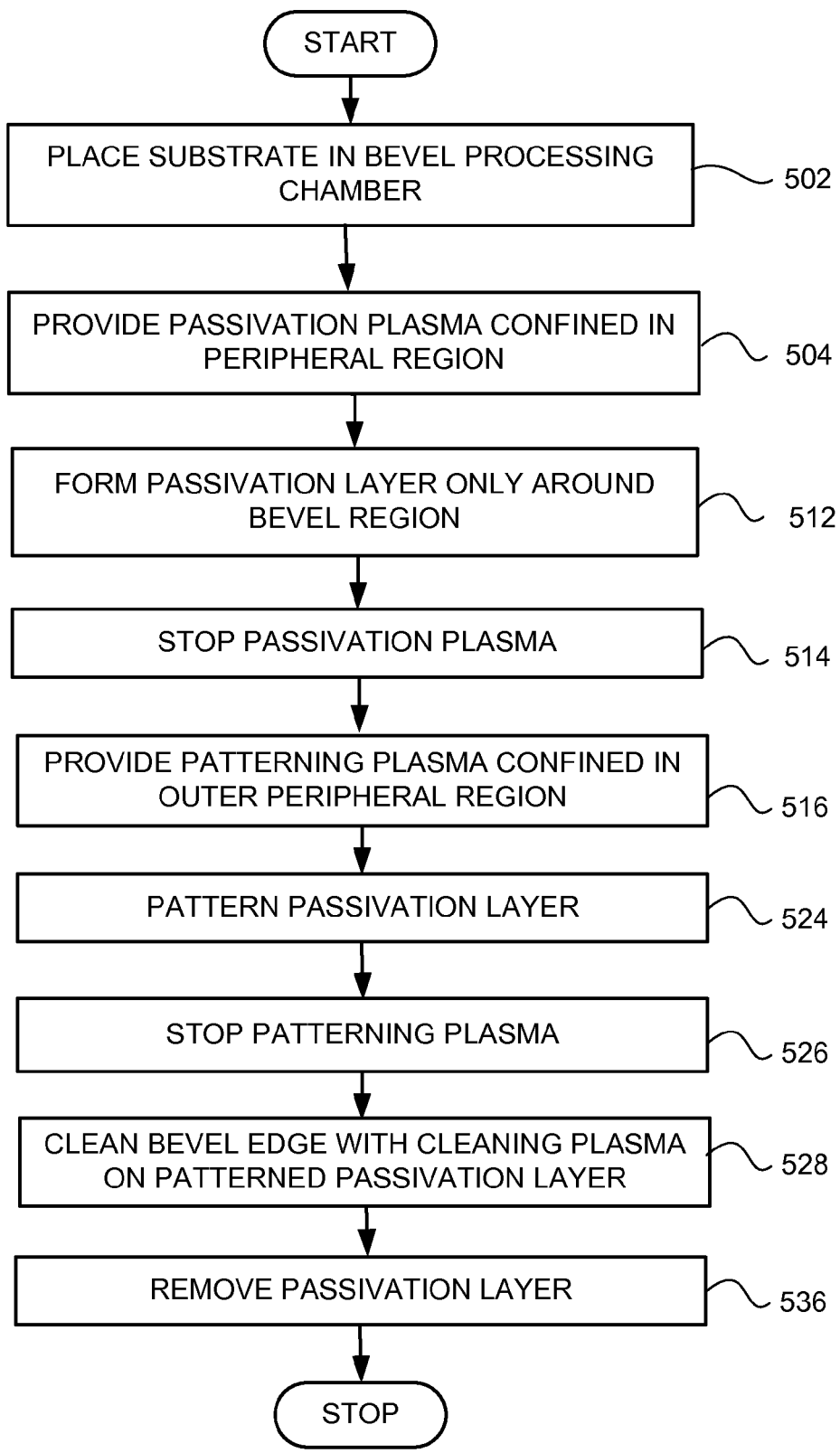
FIG. 5A is a high level flow chart of a method for processing a substrate, in accordance with another embodiment of the present invention.
Figure 5B:
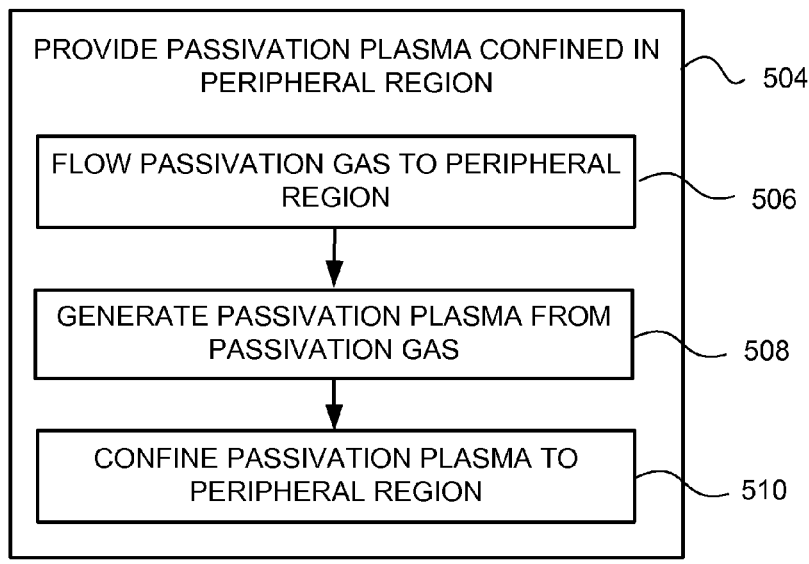
FIGS. 5B-5E are more detailed flow charts for process steps of processing the substrate shown in FIG. 5A.
Figure 5D:
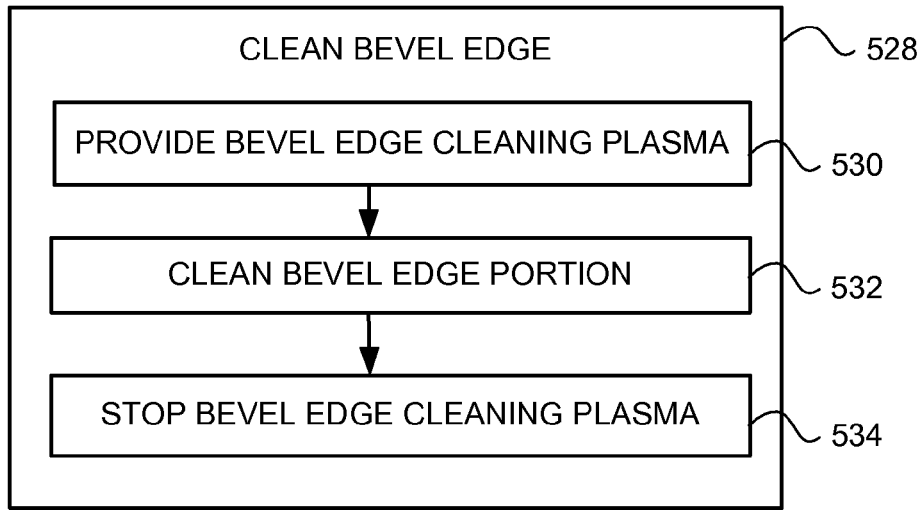
Figure 5E:
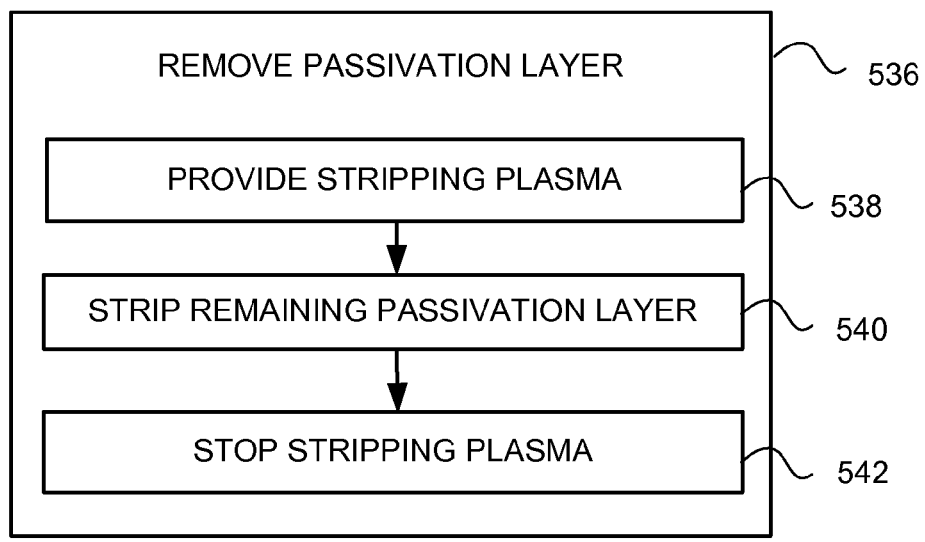
Figure 6E:
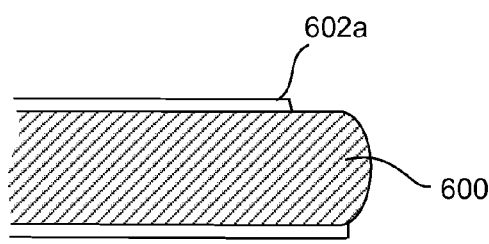

After cleaning the bevel edge, the remaining passivation layer 608a is removed (536), as shown in FIGS. 5A and 6E. The removal of the remaining passivation layer 608a may be performed using any conventional method. However, in accordance with one embodiment of the present invention, the removal of the remaining passivation layer 608a may also be performed in situ using the same bevel processing chamber 100. For example, the removal of the remaining passivation layer 608a may include, as shown in FIG. 5E, providing a stripping plasma (538), stripping the remaining passivation layer using the stripping plasma (540), and stopping the stripping plasma (542). The stripping plasma may be provided to the peripheral region where the remaining passivation layer 608a exists, by reducing the plasma confinement in the bevel processing chamber 100 such that the stripping plasma extends toward the center of the substrate so as to cover the remaining passivation layer 608a. For example, the gap 140 may be increased (for example, to about 0.60 mm to 0.90 mm), and a stripping gas containing $O_2$ is provided to form a stripping plasma. The stripping process may continue for about 10 seconds using $O_2$ only chemistry, or about 60 seconds using $CO_2$ chemistry.

Figure 8A:
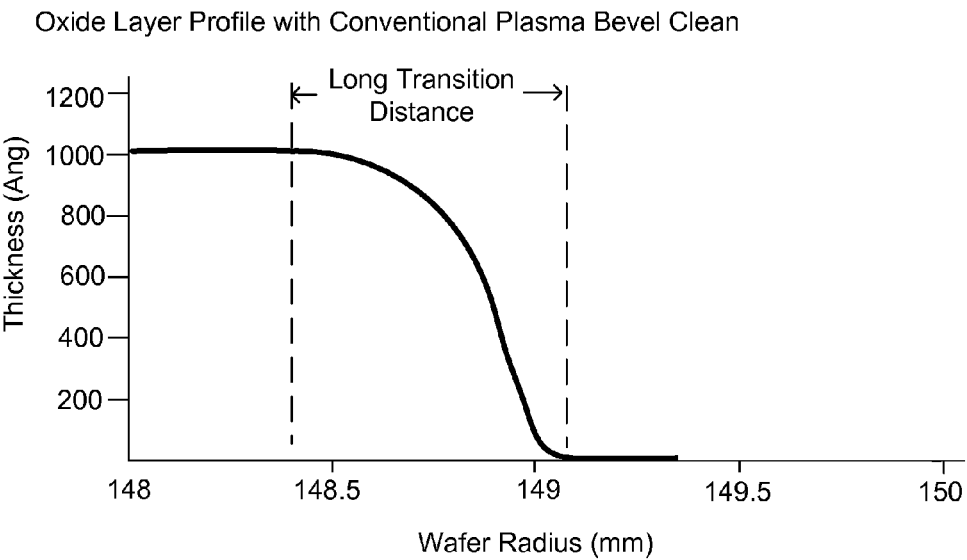
FIG. 8A is a diagram schematically illustrating an example of the oxide layer profile after a conventional plasma bevel cleaning process.
Figure 8B:
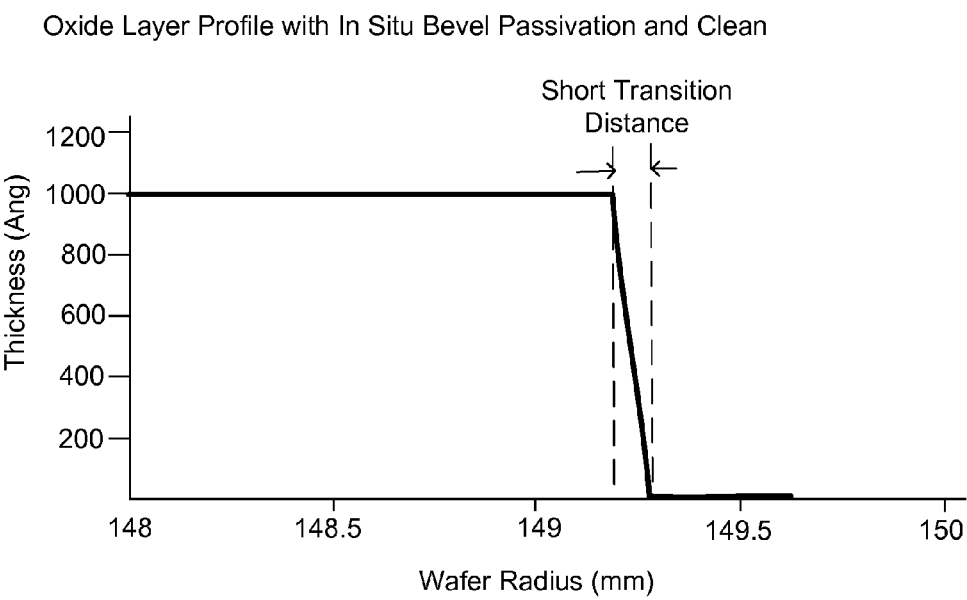
FIG. 8B is a diagram schematically illustrating an example of the oxide layer profile after the bevel edge cleaning in accordance with an embodiment of the present invention.

FIG. 8A schematically illustrates an example of the oxide layer profile after a conventional plasma bevel cleaning process. Although a confined plasma in a conventional bevel cleaning process creates asymptotically increasing etch rate so as to selectively etch and pattern an oxide layer, the profile has a transition (from the full thickness to complete removal) distance of the order of 0.5 mm, as shown in FIG. 8A. FIG. 8B schematically illustrates an example of the oxide layer profile after the bevel edge cleaning in accordance with an embodiment of the present invention. By using a mask of the patterned passivation layer and a highly selective process, as described above, the transition distance decreases to the order of less than 0.05 mm (the threshold of thin film metrology resolution), as shown in FIG. 8B. That is, in accordance with embodiments of the present invention, the cleaned bevel region and untouched device region are clearly defined and sharply delineated.

It should be noted that other conventional method of bevel cleaning such as chemical-mechanical polishing and wet cleaning can form a very sharp slope (i.e., a short transition distance) of such an oxide layer, while they do not provide good repeatability control and may not be able to clean all films. Thus, embodiments of the present invention provide a small transition distance with advantages of plasma bevel cleaning, such as good repeatability and flexibility. Furthermore, all of the processes from passivation, patterning, and bevel cleaning can be performed in situ using the same bevel processing chamber. In addition, the subsequent passivation layer removal may also be performed in situ using the same bevel processing chamber.

Figure 6F:
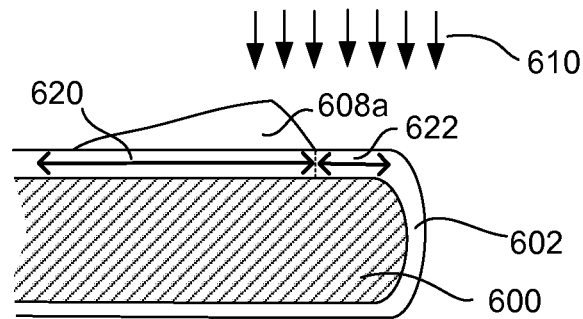
FIGS. 6F-6H are diagrams schematically illustrating the bevel edge portion of a substrate in the peripheral region during the bevel processing in accordance with other embodiments of the present invention.

In accordance with another embodiment, the remaining passivation layer 608a may also protect the device region 620 near the edge during the etching process, as shown in FIG. 6F which corresponding to the process shown in FIG. 6C. For example, there may be critical device pattern 2 mm inside from the bevel edge, and a defect region at 1.8 mm from the bevel edge. In other words, the region at 1.8 mm and outward is considered as a defect region (defective layer) 622. Thus, it is desirable to reduce the transition distance between where the underlying layer is to be cleaned (the defect region) and where the underlying layer is not to be cleaned (the protected portion or device region). If the device region 620 is close to the defect region 622, reducing the transition distance is important, and the passivation layer not only protects the dielectric/oxide layer, but also protects the device region inside the wafer edge exclusion. The dielectric layer may used as a stand-in so as to monitor the transition distance. In a conventional plasma bevel clean, a relatively longer transition distance on the order of 1 mm is created after etching the dielectric layer, as shown in the thickness profile measurement of FIG. 8A. With the passivation layer deposition and patterning, a shorter transition distance on the order of 0.1 mm or less is measured after etching the dielectric layer, as shown in the thickness profile measurement of FIG. 8B.

Figure 6G:
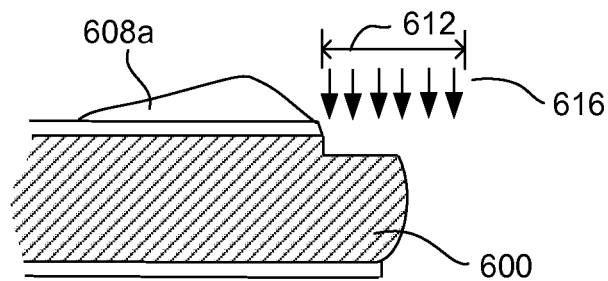
Figure 6H:
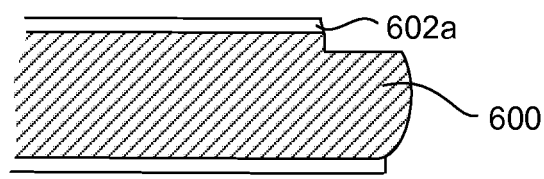

In accordance with yet another embodiment of the present invention, the bevel edge cleaning process continues after removing the underlying layer 602 (FIG. 6D) so as to partially etch the substrate material 600 (silicon wafer, for example) below the underlying layer 602, as shown in FIG. 6G. For example, after stopping the cleaning plasma for removing the oxide layer 602, a different etching (cleaning) gas is provided to generate a second bevel edge cleaning plasma 616 to etch the silicon wafer 600. For example, a cleaning gas containing $SF_6$ and Ar may be used to generate a second bevel edge cleaning plasma for such silicon etching. The second bevel edge cleaning plasma 616 may be provided at the same region as that for the first bevel edge cleaning plasma 614 for removal of the underlying layer 602. Since the device region is still protected by the remaining passivation layer 608a, the plasma confinement of the second cleaning plasma does not have to strict or precise. The etching/cleaning process may continue for about 8 seconds to 10 seconds. It should be noted that the bevel edge cleaning gas has a good etch selectivity for the targeted layer. For example, the etch selectivity (oxide layer:Si:passivation (polymer) layer) of the $CHF_3$—$N_2$ chemistry may be about 7:1:0.7, and that of the $SF_6$—Ar chemistry may be about 1:20:~0 (very low). After cleaning the bevel edge, the remaining passivation layer 608a is removed (536), as shown in FIGS. 5A and 6H. The removal of the remaining passivation layer 608a may be performed using any conventional method, as described above.

Figure 9:
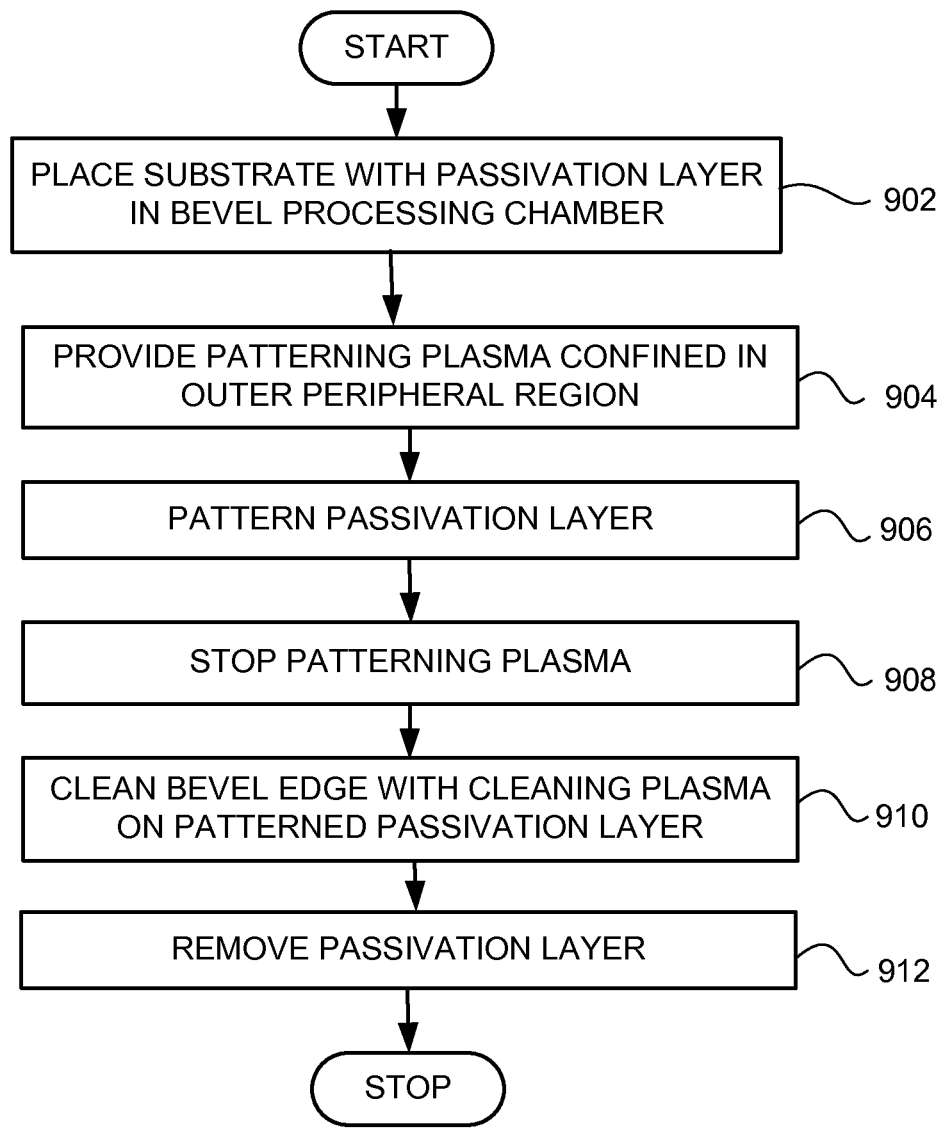
FIG. 9 is a process flow chart of a method for cleaning the bevel edge of a substrate, in accordance with one embodiment of the present invention.
Figure 10A:
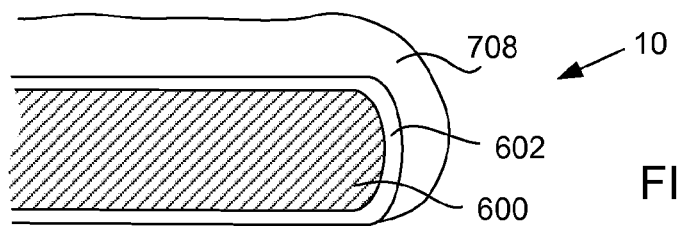
FIGS. 10A-10D are diagrams schematically illustrating an example of the bevel edge portion of a wafer in the peripheral region during the bevel edge cleaning.

FIG. 9 illustrates a process flow of a method for cleaning a bevel edge of a substrate in accordance with another embodiment of the present invention. FIGS. 10A-10E schematically illustrate an example of the bevel edge portion of a wafer in the peripheral region during the bevel edge cleaning. The like elements are denoted using the like numeral references. The substrate 10 is placed in a bevel processing chamber (902). In this example, the substrate 10 has a passivation layer 708 which has been formed thereon using any conventional method, as shown in FIG. 10A. The passivation layer 708 may be formed using spin-coating, deposition, and the like, and may be made of polymer or inorganic material. The passivation layer 708 may cover the entire surface of the substrate 10. Similarly to the previous examples, the bevel process chamber 100 may be used to perform the bevel edge cleaning. A patterning plasma 610 confined in an outer peripheral region 612 of the bevel processing chamber is provided (904). The patterning plasma 610 may be provided by flowing a patterning gas to the outer peripheral region 612, generating the patterning plasma 610 from the patterning gas, and confining the patterning plasma 610 to the outer peripheral region 612, similarly to the process shown in FIG. 5C. The patterning plasma 610 may be confined in the outer peripheral region 612 by setting the gap 140 to have a small distance, similarly to the previous example. The patterning gas 610 may be oxygen ($O_2$) gas, preferably $O_2$ only, if the passivation layer 708 is a polymer.

Figure 10B:
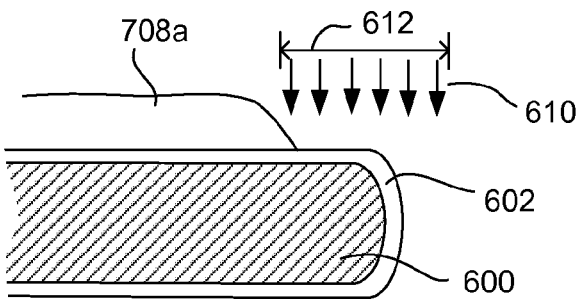

The passivation layer 708 is patterned using the patterning plasma 610 (906), by removing the passivation layer 708 on an outer edge portion of the bevel region of the substrate, while maintaining the remaining part of the passivation layer 708a on an inner portion of the bevel region, as shown in FIG. 10B. After the patterning, the patterning plasma 610 is stopped (908).

Figure 10C:
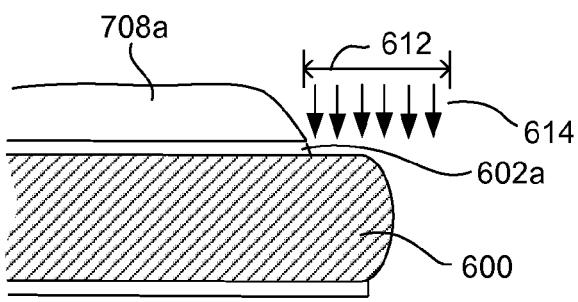

The bevel edge of the substrate is then cleaned using the patterned passivation layer 708a as a protective mask (910). The bevel edge cleaning process (910) may include providing a bevel edge cleaning plasma in the bevel processing chamber, cleaning the outer edge portion of the substrate using the bevel edge cleaning plasma, and stopping the bevel edge cleaning plasma, similarly to the process shown in FIG. 5D. The bevel edge cleaning plasma may be provided by flowing a cleaning gas to the peripheral region, and generating the bevel edge cleaning plasma from the cleaning gas by providing an RF power. The bevel edge clearing plasma 614 may be confined in the outer peripheral region 612 similarly to the patterning plasma 610, as shown in FIG. 10C. However, since the device area (region which is not to be touched by the cleaning plasma) is protected by the remaining passivation layer 708a, the plasma confinement of the bevel edge cleaning does not have to be strict or precise as that for the patterning plasma 610. For example, the cleaning plasma may be formed in the peripheral region which is (inwardly) broader than the outer peripheral region.

Figure 10D:
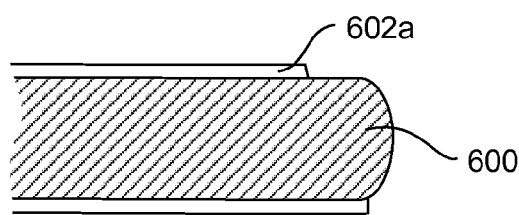

Similarly to the previous example, the bevel edge cleaning process (910) may include etching away the exposed underlying layer 602 as shown in FIG. 10C. After cleaning the bevel edge, the remaining passivation layer 708a is removed (912), as shown in FIG. 10D. The removal of the remaining passivation layer 708a may be performed using any conventional method. In one embodiment of the present invention, the gas distribution plate 106 is made of a conductive material and is movable to increase the spacing between the surface of the substrate and the gas distribution plate 106 to such a distance that plasma may be maintained between the gas distribution plate 106 and the substrate. In such an embodiment, the bevel processing chamber may also be used as a strip chamber for removing the remaining passivation layer 708a from the substrate. It should be noted that, similarly to the previous examples, the passivation layer not only protects the dielectric/oxide layer, but also protects the device region inside the wafer edge exclusion. In addition, the bevel edge cleaning (910) may further include further etching into the wafer material (silicon) 600 so as to form a step in the substrate (not shown), similarly to the previous examples.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for processing a substrate, comprising:
   placing a substrate in a bevel processing chamber;
   providing a passivation plasma confined in a peripheral region of the bevel processing chamber;
   forming, using the passivation plasma, a passivation layer on the substrate only around a bevel region of the substrate;
   stopping the passivation plasma;
   providing a patterning plasma formed in an outer peripheral region of the processing chamber, by increasing plasma confinement such that the patterning plasma is formed in the outer peripheral region farther from a center of the substrate;
   patterning the passivation layer using the patterning plasma, by removing the passivation layer on an outer edge portion of the bevel region, while maintaining the passivation layer on an inner portion of the bevel region;
   stopping the patterning plasma;
   cleaning the bevel edge of the substrate using the patterned passivation layer as a protective mask; and
   removing the remaining passivation layer.

2. The method according to claim 1, wherein said providing the patterning plasma includes:
   flowing a patterning gas to the outer peripheral region;
   generating the pattering plasma from the patterning gas; and
   confining the patterning plasma to the outer peripheral region.

3. The method according to claim 1, wherein said bevel processing chamber comprises:
   a substrate support receiving the substrate, the substrate support having a diameter smaller than a diameter of the substrate;
   a gas distribution plate opposing the substrate support;
   a bottom edge confinement ring with a varying outer diameter to control the physical confinement of the plasma on a backside of the substrate;
   a top edge confinement ring with a varying outer diameter to control the physical confinement of the plasma on a frontside of the substrate;
   a bottom edge electrode surrounding the substrate support and electrically isolated therefrom; and
   a top edge electrode opposing the bottom edge electrode, the top edge electrode surrounding the gas distribution plate and electrically isolated therefrom,
   wherein said increasing the plasma confinement includes at least one of:
   reducing a distance between the gas distribution plate and a surface of the substrate facing the distribution plate; and
   controlling the outer diameter of the top and bottom edge confinement rings,
   and wherein the patterning plasma is generated between the bottom edge electrode and the top edge electrode by providing an RF power.

4. The method according to claim 1, wherein said patterning exposes an underlying layer below the passivation layer in the outer edge portion, said cleaning the bevel edge including:
   removing the exposed underlying layer made of an oxide film from the outer edge portion.

5. The method according to claim 1, wherein said cleaning the bevel edge includes:
   providing a bevel edge cleaning plasma in the bevel processing chamber;
   cleaning the outer edge portion of the substrate using the bevel edge cleaning plasma; and
   stopping the bevel edge cleaning plasma.

6. The method according to claim 5, wherein said providing the bevel edge cleaning plasma includes:
   flowing a cleaning gas to the peripheral region; and
   generating the bevel edge cleaning plasma from the cleaning gas by providing an RF power.

7. The method according to claim 1, wherein said removing the remaining passivation layer includes:
   providing a stripping plasma by reducing the plasma confinement in the bevel processing chamber such that the stripping plasma extends toward the center of the substrate to cover the remaining passivation layer;
   stripping the remaining passivation layer using the stripping plasma; and
   stopping the stripping plasma.

8. A method for cleaning a bevel edge of a substrate, comprising:

placing a substrate in a bevel processing chamber, the substrate having an existing passivation layer formed thereon;

providing a patterning plasma formed in an outer peripheral region of the bevel processing chamber;

patterning the passivation layer using the patterning plasma, by removing the passivation layer on an outer edge portion of the bevel region of the substrate, while maintaining the passivation layer on an inner portion of the bevel region;

stopping the patterning plasma;

cleaning the bevel edge of the substrate using the patterned passivation layer as a protective mask; and removing the remaining passivation layer.

9. The method according to claim 8, wherein said providing the patterning plasma includes:

flowing a patterning gas to the outer peripheral region;

generating the patterning plasma from the patterning gas; and confining the patterning plasma to the outer peripheral region.

10. The method according to claim 9, wherein said bevel processing chamber comprises:

a substrate support receiving the substrate, the substrate support having a diameter smaller than a diameter of the substrate;

a gas distribution plate opposing the substrate support;

a bottom edge confinement ring with a varying outer diameter to control the physical confinement of the plasma on a backside of the substrate;

a top edge confinement ring with a varying outer diameter to control the physical confinement of the plasma on a frontside of the substrate;

a bottom edge electrode surrounding the substrate support and electrically isolated therefrom; and a top edge electrode opposing the bottom edge electrode, the top edge electrode surrounding the gas distribution plate and electrically isolated therefrom, wherein said confining the pattering plasma includes at least one of:

controlling a distance between the gas distribution plate and a surface of the substrate facing the distribution plate; and controlling the outer diameter of the top and bottom edge confinement rings, and wherein the patterning plasma is generate between the bottom edge electrode and the top edge electrode by providing an RF power.

11. The method according to claim 9, wherein said cleaning the bevel edge includes:

flowing a cleaning gas to the peripheral region in the bevel processing chamber;

generating a bevel edge cleaning plasma from the cleaning gas;

cleaning the outer edge portion of the substrate using the bevel edge cleaning plasma; and stopping the bevel edge cleaning plasma.

12. The method according to claim 11, wherein said bevel processing chamber comprises:

a substrate support receiving the substrate, the substrate support having a diameter smaller than a diameter of the substrate;

a bottom edge electrode surrounding the substrate support and electrically isolated therefrom;

a gas distribution plate opposing the substrate support; and a top edge electrode opposing the bottom edge electrode, the top electrode surrounding the gas distribution plate and electrically isolated therefrom, wherein the cleaning gas is provided through a gap between the gas distribution plate and a surface of the substrate facing the distribution plate, and wherein the cleaning plasma is generate between the bottom edge electrode and the top edge electrode by providing an RF power.

* * * * *